(12) United States Patent
Ino (10) Patent No.: US 6,532,567 B2
(45) Date of Patent: *Mar. 11, 2003

(54) METHOD AND APPARATUS OF VITERBI DETECTION FOR TRELLIS-CODE

(75) Inventor: Hiroyuki Ino, Gunma (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/422,494

(22) Filed: Oct. 21, 1999

(65) Prior Publication Data

US 2003/0009724 A1 Jan. 9, 2003

(30) Foreign Application Priority Data

Oct. 22, 1998 (JP) .............................. 10-301482

(51) Int. Cl.[7] .......................... G06F 11/00; H03M 13/03
(52) U.S. Cl. ....................................... 714/798; 714/795
(58) Field of Search ................................ 714/789, 798, 714/795, 700, 792

(56) References Cited

U.S. PATENT DOCUMENTS

| | | | | | |
|---|---|---|---|---|---|
| 4,641,327 A | * | 2/1987 | Wei | ............................ | 375/260 |
| 5,231,639 A | * | 7/1993 | Matui | .......................... | 375/354 |
| 5,428,646 A | * | 6/1995 | Eyuboglu | .................... | 375/340 |
| 5,757,834 A | * | 5/1998 | Fang et al. | .................. | 714/789 |
| 5,771,127 A | * | 6/1998 | Reed et al. | ..................... | 360/40 |
| 5,802,118 A | * | 9/1998 | Bliss et al. | .................. | 375/350 |
| 6,021,011 A | * | 2/2000 | Behrens et al. | ................ | 360/51 |
| 6,023,386 A | * | 2/2000 | Reed et al. | ..................... | 360/46 |
| 6,032,284 A | * | 2/2000 | Bliss | ............................ | 341/59 |
| 6,089,749 A | * | 7/2000 | Blaum et al. | ................. | 714/789 |
| 6,092,234 A | * | 7/2000 | Azakami et al. | ............ | 714/789 |
| 6,154,870 A | * | 11/2000 | Fredrickson et al. | .......... | 341/94 |
| 6,253,347 B1 | * | 6/2001 | Koslov | ........................ | 714/789 |

OTHER PUBLICATIONS

Moeneclaey, M. and Sanders, P.; Syndrome–based Viterbi decoder node synchronization and out–of–lock detection; Global Telecommunications Conference, 1990, and Exhibition. 'Communications: Connecting the Future', GLOBECOM '90., IEEE, 1990 pp.: 604–608.*

Raheli, R.; Polydoros, A. and Ching–Kae Tzou; Per–Survivor Processing: a general approach to MLSE in uncertain environments; IEEE Transactions on Communications, vol.: 43 Issue: 2 Part: 3, Feb.–Mar.–Apr. 1995 pp.: 354–364.*

* cited by examiner

Primary Examiner—Albert Decady
Assistant Examiner—Joseph D. Torres
(74) Attorney, Agent, or Firm—Frommer Lawrence & Haug LLP; William S. Frommer; Darren M. Simon (57) ABSTRACT

A method and apparatus for Viterbi detection to detect a code sequence containing a sync word, from an output sequence on a transmission path, by using a trellis detection that has a time-variant structure. The apparatus comprising a base counter for measuring time during the trellis detection, a comparator for comparing the time when the sync word is detected and outputting a coincidence/non-coincidence signal, and a selector for selecting either an output of an ACS (Add Compare Select) circuit or a predetermined initial metric value. The likelihood of a state in which the sync word starts or ends in the trellis detection is initialized only if the time the sync word is detected does not coincide with a time extrapolated before the sync word is detected.

5 Claims, 7 Drawing Sheets

METHOD AND APPARATUS OF VITERBI DETECTION FOR TRELLIS-CODE

BACKGROUND OF THE INVENTION

The present invention relates to a method of Viterbi detecting and an apparatus for Viterbi detecting. More particularly, the invention relates to a method and apparatus which are suitable for Viterbi detecting by the use of a detection trellis that has a time-variant structure.

To transmit (or record) data, a block sync signal is usually added to the head of each data block (hereinafter referred to as lock). The block sync signal is detected when the data is received (or reproduced), thereby to detect the head of the block. The term lock, as used here, means a data unit that consists of a plurality of data words or code words. A block recorded on DAT (Digital Audio Tape), for example, is composed of a 1-symbol ID (Identity) data item, a 1-symbol ID parity and a 32-symbol data word. That is, this data block consists of 36 symbols. Each symbol consists of 8 bits before it is encoded to an 8/10 recording code, and by 10 bits after it is encoded to an 8/10 recording code. To record the block, the 8-bit symbols forming the block are encoded to 8/10 codes. Thereafter, a sync signal (sync word), which is a 1-symbol (10 bits) and which does not exist in the sequence of 8/10 codes, is added to the head of the block. To reproduce the block, the sync word is detected, thus finding the head of the block. Then, the ID data, parity and 32-symbol data word are decoded, symbol by symbol. The 8/10 codes have been generated to accomplish NRZI (nonreturn-to-zero interval) recording. The maximum length Tmax of a train of identical bits, existing in the NRZI-converted sequence of 8/10 codes, is 4. Two or more identical bit trains having Tmax would not follow one after another. The sync word contains a pattern in which Tmax continuously appears at least twice, though Tmax does not appear in the sequence of codes. The Tmax distinguishes the sync word from the sequence of codes.

In recent years, the TCPR (Trellis-Coded Partial Response) system has been studied with enthusiasm in the field of magnetic recording. In this system, the partial response characteristic and the code characteristic are integrated, thereby to increase the Euclidean distance between the output sequences on a transmission path (recording/reproducing path), i.e., free square Euclidean distance $d^2_{free}$. An increase of distance $d^2_{free}$ is equivalent to a rise of signal level. Hence, the TCRP system enhances SNR (Signal-to-Noise Ratio) at the time of detecting data. Codes used in the TCRP system are generally called Trellis signals. The assignee of the present application has proposed 16/20 trellis codes in Japanese Patent Application No. 10-207372.

Figure 5:
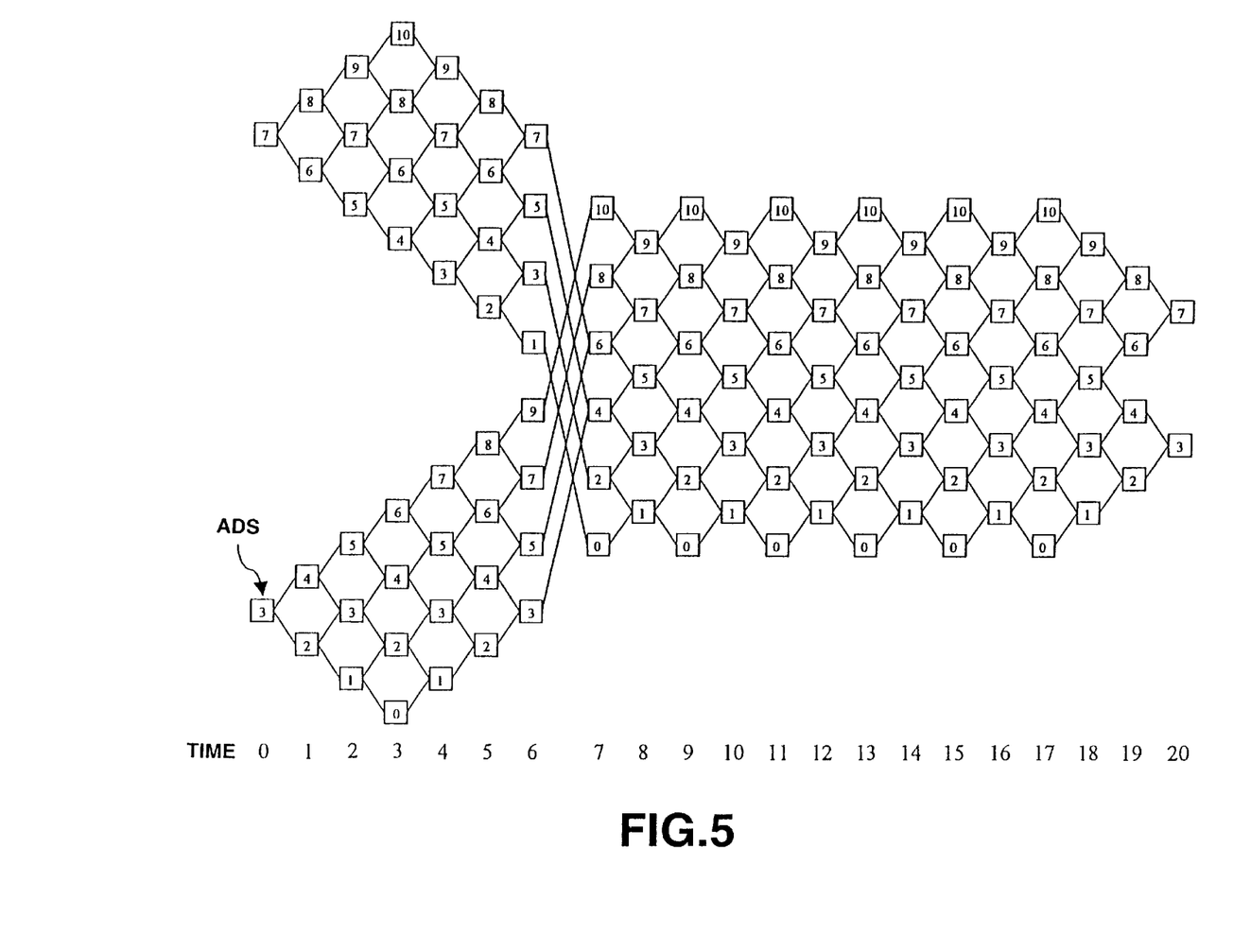
FIG. 5 is a diagram representing the ADS trellis of 16/20 codes, which the assignee of the present application has proposed.

FIG. 5 shows an ADS trellis illustrating the transition of an ADS (Alternating Digital Sum) that a 20-bit code word assumes. The ADS can range from 0 to 10 for the code word. However, the ADS at the start point and the ADS at the end point can take only two values, i.e., 3 and 7. Further, the ADSs at time 7 are limited to the values shown in FIG. 5, in accordance with whether the value of the ADSs at the start points is 3 or 7. An ADS is the sum of symbols acquired to the present time, from a time in the infinite past or from the start of encoding the symbols, each symbol being −1 or +1 allocated to one code bit, and every other symbol having been multiplied by 1. If the ADs for a sequence of codes is set within a specific range, the Nyquist frequency component of the code power density, i.e., the frequency component which is half (½) the code bit rate, can be reduced to null.

It is known that the distance $d^2_{free}$ increases when the null point of the code power density is made to coincide with the null point of the transfer function of the transmission path. The power density of a 16/20 code has the null point at the Nyquist frequency. This code is therefore a trellis signal to a partial response whose transfer function has a null point at the Nyquist frequency.

Figure 6:
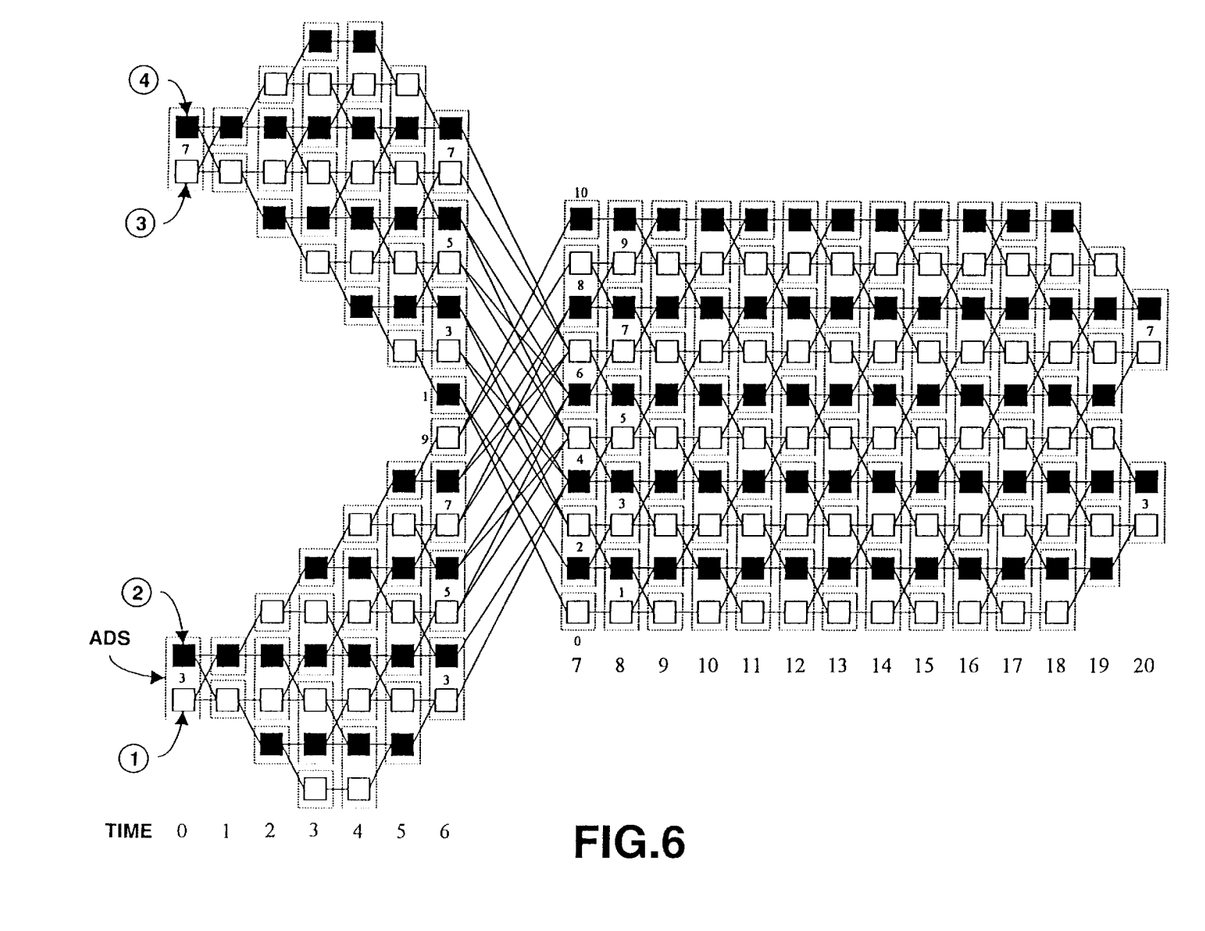
FIG. 6 is a diagram showing a detector trellis for detecting TCPR1 by the use of 16/20 codes.

FIG. 6 depicts a detector trellis that is used to Viterbi detect in the TCPR system, by the use of a class-1 partial response. The detector trellis has a structure, which is a combination of the characteristic of the code and the characteristic of the class-1 partial response. (The characteristic of the code is the ADS trellis of FIG. 5, hereinafter referred to as code trellis. The transfer function of the class-1 partial response has a null point at the Nyquist frequency.) The structure shown in FIG. 6 is time-variant in units of code words. This is why a sequence can be detected in the TCPR system only when the boundary between the adjacent code words is determined.

Figure 7:
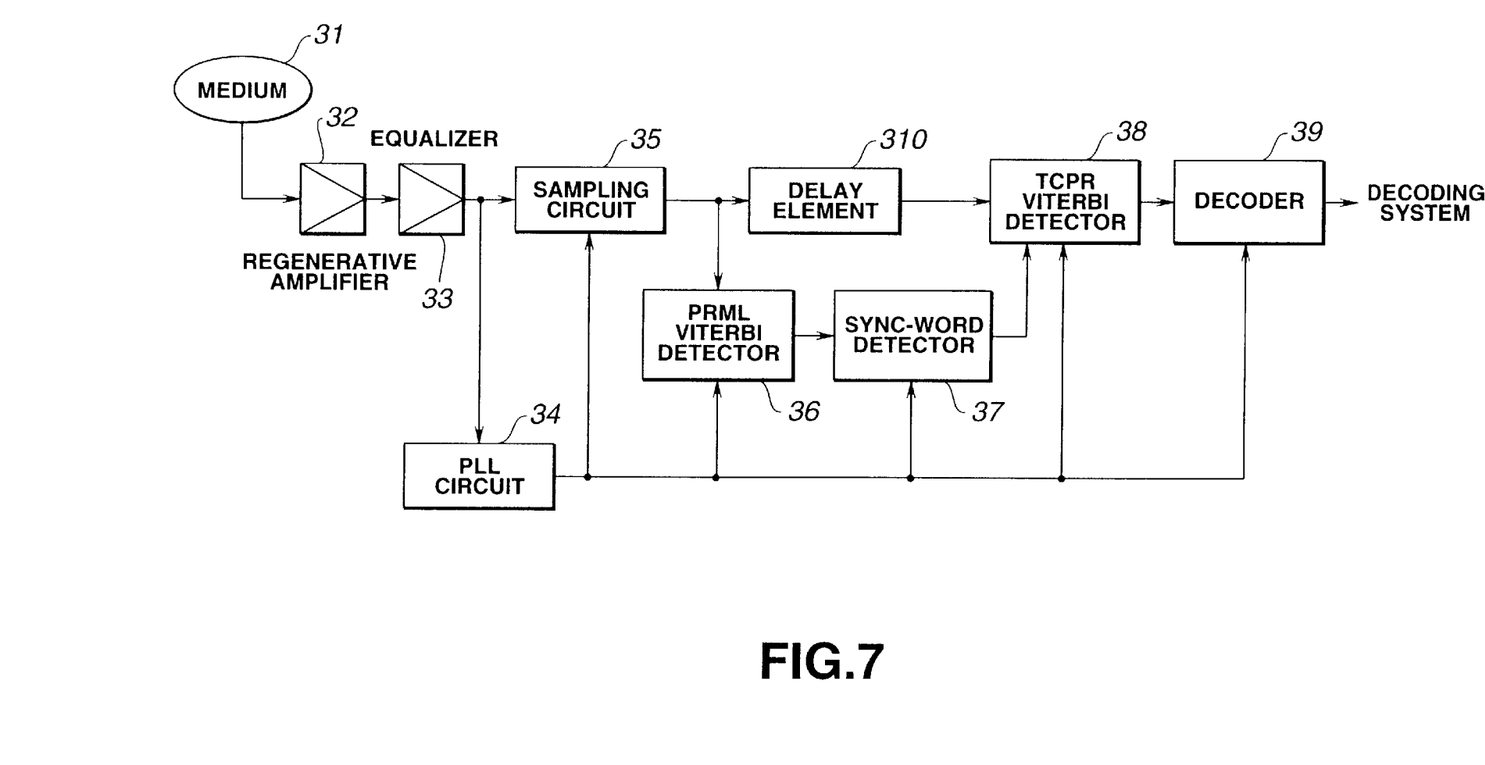
FIG. 7 is a block diagram of the reproduction apparatus that the assignee of the present application has proposed.

FIG. 7 shows a reproduction apparatus of a TCPR system, in which a time-variant trellis is utilized. The signal reproduced from a medium 31 and amplified by a regenerative amplifier 32 is equalized to a prescribed partial-response characteristic by means of an equalizer 33. Then, a PLL 34 extracts a clock signal from the output signal of the equalizer 33. The PRML(Partial Response Maximum Likelihood) Viterbi detector 36, sync word detector 37, TCPR Viterbi detector 38 and decoder 39, all incorporated in the reproduction apparatus, operate in accordance with the clock signal. The signal equalized to the prescribed partial-response characteristic and output from the equalizer 33 is sampled by a sampling circuit 35 and then input to the TCPR Viterbi detector 38 via a delay element 310. The PRML Viterbi detector 36 detects, using a detector trellis that has no characteristics of a time-variant trellis. Therefore, the PRML Viterbi detector 36 need not determine the boundary between adjacent code words and can detect data asynchronously. The bit train the PRML Viterbi detector 36 has detected is input to the sync word detector 37. The sync word detector 37 detects a sync word from the bit train and supplies the sync word to the TCPR Viterbi detector 38. The TCPR Viterbi detector 38 detects, using a detector trellis that has the characteristics of a time-variant trellis (i.e., the trellis shown in FIG. 6). Hence, the TCPR Viterbi detector 38 cannot correctly operate unless the boundary between adjacent code words is determined. The TCPR Viterbi detector 38 is thereby synchronized by the input sync word and starts detecting one block of data. The data thus detected by the TCPR Viterbi detector 38 is input to the decoder 39, which decodes code words. The delay element 310 is provided to delay the output of the equalizer 33 by the same time the sync word detected has delayed due to the internal delays of the PRML Viterbi detector 36 and sync word detector 37.

The accuracy of detecting the block sync word greatly influences the reception of data or the quality of the data reproduced. For example, one block of data will be lost in its entirety if the sync signal is not detected due to disturbance. If the sync signal is detected incorrectly, data will be lost for the period between the time when the sync signal is incorrectly detected and the time when the sync signal is correctly detected. In the case of DAT (Dynamic Address Translation), the ID data will be erroneously detected, too, if the sync word is detected incorrectly. The ID data contains address data. If the incorrectly detected address data is used, thereby writing data into a memory, the data of any other block may be destroyed.

The characteristics of a trellis code are not imparted to the PRML Viterbi detector 36 shown in FIG. 7. Therefore, the reproduction apparatus of a TCPR system cannot obtain a gain. It follows that the output from the PRML Viterbi detector 36 is inevitably inferior to the output of the TCPR Viterbi detector 38 in terms of quality.

No TCPR system is employed in DAT. Only one data detector is used, and the accuracy of detecting a sync word is the same as that of detecting data. In the reproduction apparatus of FIG. 7, however, the accuracy of detecting the sync word is much lower than that of detecting data. This will impose a very adverse influence on the reception of all data or the quality of the data reproduced, as mentioned above. It is therefore desired that the accuracy of detecting the sync word be rendered sufficiently high by any means.

In the reproduction apparatus of FIG. 7, the sync word is used for synchronizing the TCPR Viterbi detector 38. Thus, the sync word need not have such a time-variant trellis structure as is illustrated in FIG. 6. There will be some advantage, however, if the sync word has the time-variant structure. One of the advantages lies in that the sync word can be detected from the output sequence of the TCPR Viterbi detector 38, too, without changing the operation mode of the detector 38, provided that the sync word has the time-variant trellis structure that the TCPR Viterbi detector 38 uses. The result of detecting this sync word is so reliable that it can be applied to verify the sync-word detection signal obtained from the output sequence of the PRML Viterbi detector 36. If the sync word does not maintain the detection trellis structure that the TCPR Viterbi detector uses, the sync work cannot be detected by means of TCPR Viterbi detection. Therefore, it is impossible to detect sync signals from the output sequence of the TCPR Viterbi detector 38.

Another advantage lies in that TCPR Viterbi detection can be started at the head of the sync word if the sync word has a time-variant structure. This helps the likelihood to converge in the Viterbi detection. Viterbi detection is one of maximum likelihood decoding methods. In the Viterbi detection, the likelihood of every state in the detector trellis is examined, thereby determining the most likely sequence. Assume that the Viterbi detection is started with the data immediately following the sync word at the very time the TCPR Viterbi detector 38 is synchronized. Right after the TCPR Viterbi detector 38 is synchronized, the likelihood of each state in the detector trellis does not always have an appropriate value. This is because the likelihood of any state, which is obtained while the detector 38 remains asynchronous, is insignificant. In the case where the likelihood does not have an appropriate value, the detection accuracy will decrease until the likelihood converges to a desirable value, if the Viterbi detection has been started with the data. Nonetheless, if the Viterbi detection is started with the sync word, it is possible to save time for the convergence of likelihood, and it can be expected that the likelihood has converged at the start of detecting the data.

The likelihood of each state at time 0 in the detector trellis may be initialized at the very time of synchronizing the TCPR Viterbi detector 38. To this end, it is necessary to determine in which state at time 0 the Viterbi detection should be started. The likelihood of the state can be set at a high value if the state of the start point of the detector trellis is known. Thus, data can be detected with high reliability from the beginning, well before the likelihood converges.

The Viterbi detector may be already synchronized with the output sequences on the transmission path, which has been input to the Viterbi detector. In other words, the Viterbi detector and the output sequence on the transmission path may be synchronous with each other. If this is the case, it is not always necessary to set the likelihood every time a sync signal is detected. Rather, the likelihood may possibly be distorted.

BRIEF SUMMARY OF THE INVENTION

Accordingly, the object of this invention is to provide a method of Viterbi detecting and an apparatus for Viterbi detecting, both capable of Viterbi detecting without distorting the path-metric value by applying a prescribed fixed metric.

According to the present invention there is provided a method of Viterbi detecting for detecting a code sequence containing a sync word, from an output sequence on a transmission path, by using a detection trellis that has a time-variant structure. The method is characterized in that the likelihood of a state in which the sync word starts or ends in the detection trellis is initialized only if the time the sync word is detected in the detection trellis does not coincides with a time extrapolated in the detection trellis before the sync word is detected.

According to the invention there is provided an apparatus for Viterbi detecting, designed to detect a code sequence containing a sync word, from an output sequence on a transmission path, by using a detection trellis that has a time-variant structure. The apparatus comprises: a base counter for measuring time in the detection trellis; a comparator for comparing the time when the sync word is detected, with the time indicated by the base counter, and for outputting a coincidence/non-coincidence signal; and a selector for selecting and outputting an output of an ordinary ACS (Add Compare Select) circuit and a predetermined initial metric value. The selector selects the output of the ordinary ACS circuit when the output of the comparator indicates coincidence, and selects a prescribed initial metric value when the output of the comparator indicates non-coincidence.

The present invention uses a detection trellis having a time-variant structure. To detect a code sequence containing a sync word, from an output sequence on a transmission path, the likelihood of a state in which the sync word starts or ends in the detection trellis is initialized only if the time the sync word is detected in the detection trellis does not coincides with a time extrapolated in the detection trellis before the sync word is detected. Viterbi detection can thereby be accomplished, without changing the value of the path-metric by applying a prescribed fixed metric.

Hence, the present invention can provide a method of Viterbi detecting and an apparatus for Viterbi detecting, which can Viterbi detect without distorting the path-metric value by applying a prescribed fixed metric.

DETAILED DESCRIPTION OF THE INVENTION

An embodiment of the present invention will be described, with reference to the accompanying drawings.

In the embodiment, there is used a sync word in 16/20 codes, which will be described below.

[Characteristics of 16/20 Codes]

1. The ADS of a code sequence has a maximum amplitude (maximum change) of 10. The RDS of the code sequence has a maximum amplitude (maximum change) of 10, too. The RDS is the sum of symbols acquired to the present time, from a time in the infinite past or from the start of encoding the symbols, each being −1 or +1 allocated to one code bit "0" or "1". In the embodiment, a class-1 partial response is used as the characteristic of the transmission path (recording/reproducing path). Thus, even if the RDS is limited, it will not influence the gain in the form of a trellis signal. The characteristic of the RDS is therefore not contained in the detector trellis that a TCPR Viterbi detector uses.
2. Assume that the minimum value for both the ADS and the RDS is 0. Then, there are four states (ADS, RDS) that the sync word may take when it is at a start point or an end point. These states are: (3, 3), (3, 7), (7, 3) and (7, 7).
3. Assume that the minimum value for the ADS is 0 and that the sync word is at the start point at time 0. Then, the path extending from the state in which the ADS is 3 at time 0 does not reach the state in which the ADS is 3 or less at time 7. Further, the path extending from the state in which the ADS is 7 at time 0 does not reach the state in which the ADS is 7 or more at time 7.
4. The maximum length Tmax of a continuous train of identical symbols is 9.

Figure 1:
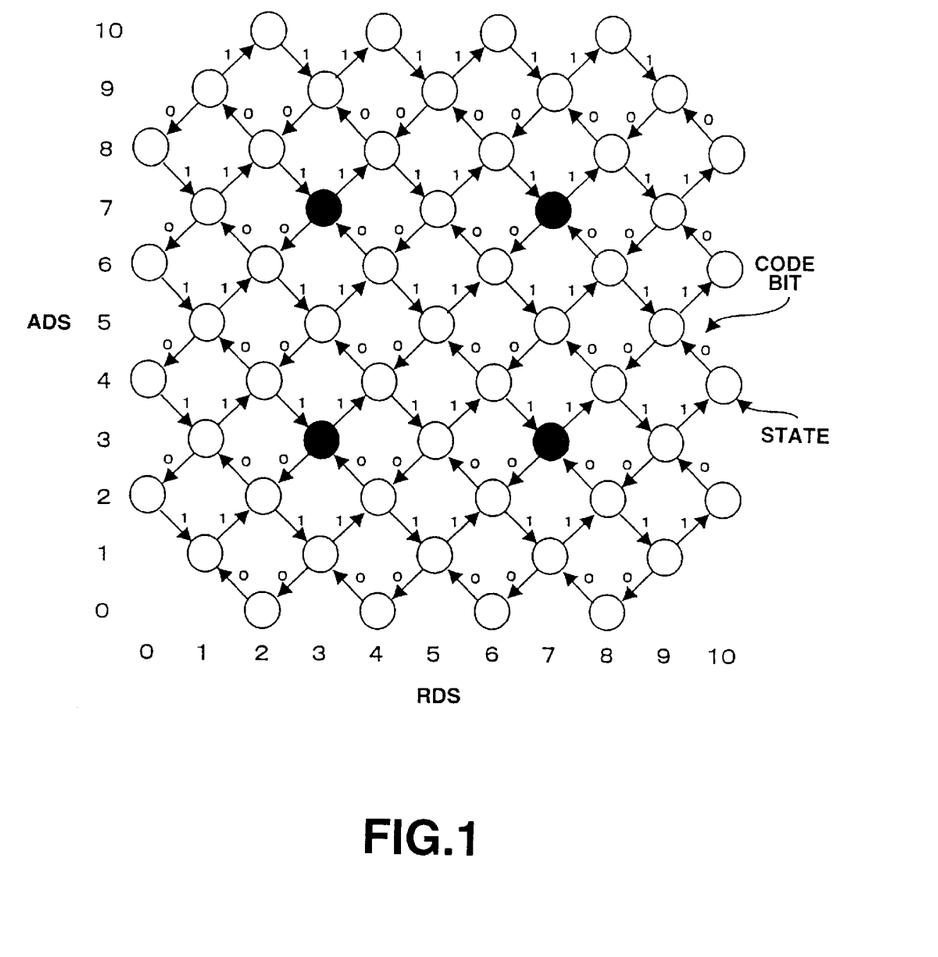
FIG. 1 is a diagram showing the transition of a finite state.

FIG. 1 is a diagram of the transition of a finite state, representing the characteristics 1 and 2 that 16/20 codes have when the minimum value for the ADS and the RDS is 0. The black dots shown in FIG. 1 indicate the states in which the sync word is at the start point or the end point. It should be noted that FIG. 5 shows a trellis of codes, which represents the characteristic 3 described above.

Constraints on the sync word will be described below. First, a sync word that observes the following constraints will be studied.

[Constraints on Sync Word 1]

1. The sync word must have the aforementioned characteristics of 16/20 codes, except characteristic 4 concerning $T_{max}$. In particular, the sync word needs to have a time-variant structure in connection with the ADS, so that the TCPR Viterbi detector 38 may Viterbi detect for the sync word in the reproduction apparatus shown in FIG. 7.
2. The sync word must have a length of 20 bits. The length of the sync word is a multiple of 20 bits since the 16/20 codes have a length of 20 bits. The shorter the sync word, the better. One of the reasons is that the sync work contains no data. Hence, the longer the sync word, the more redundant it is. Another reason is that the longer the sync word, the higher the possibility of detecting sync words. In general, the probability that the sync word has one erroneous bit can be given as: $P_e \times {}_n C_1$, where n is the length of the sync word and $P_e$ is the bit error rate.
3. The sync word must contain 10 consecutive identical bits. Identical bits continuously appear, in ones, twos, threes, and nines in the 16/20 code sequence. Hence, in a pattern having trains of identical bits, which have lengths of 1 to 9, it is impossible to design sync words that would not appear in the same code sequence. If a pattern in which 10 or more identical bits continuously appear is used, a unique sync word can be provided. However, the shorter a train of identical bits, the better. In view of this, it is desired that the sync word contain 10 consecutive identical bits at most.
4. Ten or more identical bits must not continuously appear between the sync word and the code word that immediately precedes or follows the sync word. As described above, the sync word is characterized in that it contains 10 consecutive identical bits. Thus, any train of 10 identical bits that appear between the sync word and such a code word is extremely similar to the sync word, though not identical thereto. This inevitably increases the erroneous detection of the sync word.

There are only a few block sync words that observe all constraints 1 to 4 described above. Table 1 presented below shows candidates for the sync word, specifying the states of the start and end points of each candidate. At least one of these candidates must be selected as the sync word in accordance with the state of the start point, in view of the continuity of state transition.

TABLE 1

Candidates for 20-Bit Sync Word

| No. | Start-point State | Sync Signal | End-point State |
| --- | --- | --- | --- |
| 1 | (3, 3) | 10000111111111100001 | (3, 7) |
| 2 | (3, 3) | 10000111111111100100 | (3, 7) |
| 3 | (3, 3) | 10000111111111100010 | (7, 7) |
| 4 | (3, 3) | 00100111111111100001 | (3, 7) |
| 5 | (3, 3) | 00100111111111100100 | (3, 7) |
| 6 | (3, 3) | 00100111111111100010 | (7, 7) |
| 7 | (3, 7) | 10111000000000011101 | (3, 3) |
| 8 | (3, 7) | 10111000000000011011 | (7, 3) |
| 9 | (3, 7) | 10111000000000011110 | (7, 3) |
| 10 | (7, 7) | 01111000000000011110 | (7, 3) |
| 11 | (7, 7) | 01111000000000011011 | (7, 3) |
| 12 | (7, 7) | 01111000000000011101 | (3, 3) |
| 13 | (7, 7) | 11011000000000011110 | (7, 3) |
| 14 | (7, 7) | 11011000000000011011 | (7, 3) |
| 15 | (7, 7) | 11011000000000011101 | (7, 7) |
| 16 | (7, 3) | 01000111111111100010 | (7, 7) |
| 17 | (7, 3) | 01000111111111100100 | (3, 7) |
| 18 | (7, 3) | 01000111111111100001 | (3, 7) |

Figure 2:
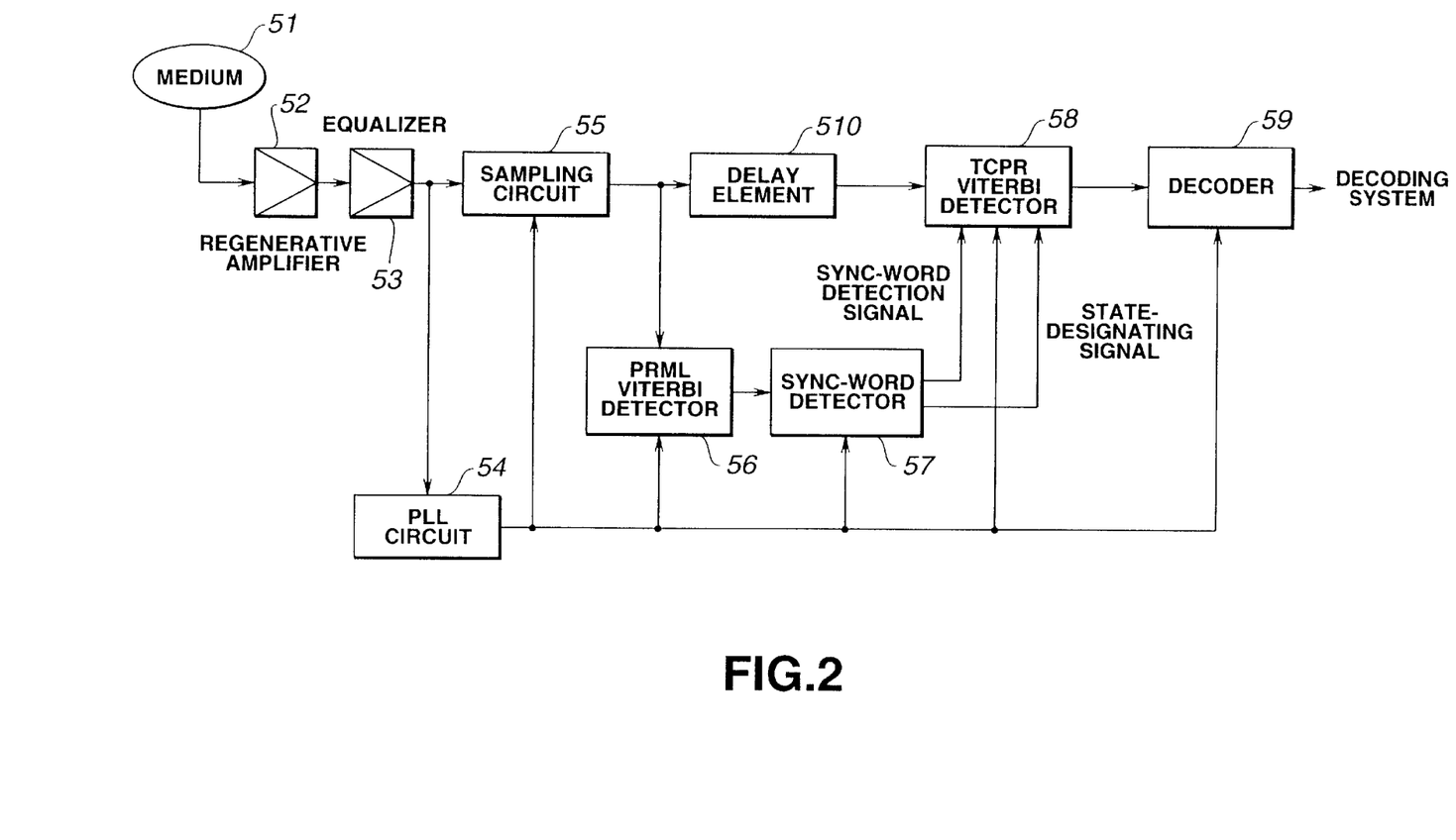
FIG. 2 is a block diagram showing a reproduction apparatus to which the present invention is applied.

FIG. 2 shows the structure of a reproduction apparatus according to the present invention.

In the reproduction apparatus of FIG. 2, the signal reproduced from a medium 51 and amplified by a regenerative amplifier 52 is equalized to a prescribed partial-response characteristic by means of an equalizer 53. Then, a PLL circuit 54 extracts a clock signal from the output signal of the equalizer 53. The PRML Viterbi detector 56, sync word detector 57, TCPR Viterbi detector 58 and decoder 59, all incorporated in the reproduction apparatus, operate in accordance with the clock signal. The signal equalized to the prescribed partial-response characteristic and output from the equalizer 53 is sampled by a sampling circuit 55 and then input to the TCPR Viterbi detector 58 via a delay element 510. The PRML Viterbi detector 56 detects, by using a detector that has no characteristics of a time-variant trellis. Therefore, the PRML Viterbi detector 56 need not determine the boundary between adjacent code words and can detect data asynchronously. The bit train the PRML Viterbi detector 56 has detected is input to the sync word detector 57. The sync word detector 57 detects a sync word from the bit train and supplies the sync word to the TCPR Viterbi detector 58. The TCPR Viterbi detector 58 detects, using a trellis detector that has the characteristics of a time-variant trellis (i.e., the trellis shown in FIG. 6). Hence, the TCPR Viterbi detector 58 cannot correctly operate unless the boundary between adjacent code words is determined. The TCPR Viterbi detector 58 is thereby synchronized by the input sync word and starts detecting one block of data. The data thus detected by the TCPR Viterbi detector 58 is input to the decoder 59, which decodes the code words. The delay element 510 is provided to delay the output of the equalizer 53 by the same time the detected sync word has delayed due to the internal delays of the PRML Viterbi detector 56 and sync word detector 57.

This reproduction apparatus differs from the reproduction apparatus shown in FIG. 7 in that the signal (state-designating signal) for setting the initial likelihood of the TCPR Viterbi detector 58 is supplied from the sync word detector 57 to the TCPR Viterbi detector 58. This signal indicates which likelihood of the TCPR Viterbi detector 58 should be increased. The signal will be described later in detail.

At the time a sync word is detected, the TCPR Viterbi detector 58 (FIG. 2) is initialized to time 0. At the same time, the sampled data delayed by a predetermined time by the delay element 510 is input to the TCPR Viterbi detector 58. The detector 58 starts Viterbi detection, by using the trellis detection illustrated in FIG. 6. In FIG. 6, the white squares represent states, each changed from the state one unit time before by a code-word bit "0". At time 0, four sates exist. It is desirable to initialize the likelihood of these four states. This is because the likelihood of each state is not so reliable right after the TCPR Viterbi detector 58 has been synchronized. Assume that one sync word is selected for the state of each start point in FIG. 1, from those shown in Table 1. Also assume sync words that start at different ADSs are unique, each having been distinguished from any other. In this embodiment, whichever sync word is selected, it would be different from any other. For example, the following four sync words may be selected for the states of start points, (3, 3), (3, 7), (7, 3), and (7, 7):

10000111111111100001,
10111000000000011101,
01000111111111100010, and
01111000000000011110.

Assume that the sync word, 10000111111100001, is selected. Then, it is known that the ADS at which this sync word starts is 3, and the ADS at which the sync word ends is 3.

Since the sync words used in the present invention observe the trellis structure shown in FIG. 6, the TCPR Viterbi detection can be started in two methods. In the first method, the detection is started at the head of the sync word. In the second method, the detection is started at the code word immediately following the sync word. Which method should be employed is determined from the delay time of the delay element 510. More specifically, the detection will be started at the head of the sync word if the delay time is set to supply the sampled data corresponding to the head of the sync word to the TCPR Viterbi detector 58 at the same time a sync-word detection signal is supplied to the TCPR Viterbi detector 58.

If the TCPR Viterbi detection is started at the head of the sync word, the ADS at which the sync word starts is 3. It is therefore known that the start point of the sync word assumes either the state (1) or (2) shown in FIG. 6. In this case, the likelihood of the states (1) and (2) can be set at a greater value than the likelihood of the states (3) and (4). Alternatively, the TCPR Viterbi detection may be started at the code word immediately following the sync word. In this case, the ADS at which the sync word ends is 3, and it is known that the start point of the sync word assumes either the state (1) or (2) shown in FIG. 6. It is also known that the start point of the code word assumes the state (2), because the last bit of the sync word is "1". In this case, the likelihood of the state (2) can be set at a greater value than the likelihood of any other state.

Suppose there are two sync words that have exactly the same pattern, though ending at different ADSs. Then, from only the information these sync words have when they are detected it is impossible to determine the state in which they are synchronized at end points in the detection trellis. Hence, sync words that end at different ADSs must be unique, each distinguished from any another, in order to initialize the likelihood of the state in which they end at end points. In the present embodiment, sync words that start at different ADSs are unique, each distinguished from any another. This is equivalent to the fact that sync words that end at different ADSs are unique, each distinguished from any other.

In this embodiment, one and only one state cannot be identified in which a sync word start in the detection trellis shown in FIG. 6 at the time the TCPR Viterbi detection is started at the head of the sync word. This is inevitably because the last bit of the code word immediately preceding the sync work is unidentified. To identify the last bit of this code word, it suffices to select two sync words that are unique, one distinguished from the other, for each state in which the sync word starts in the trellis of FIG. 1. Then, one of the sync words selected is added to the head of the block if the last bit of the code word is "0". If the last bit of the code word is "1", the other of the sync words selected is added to the head of the block. This means that the sync words that start in the state at time 0 in the detection trellis of FIG. 6 are uniquely distinguished from each other.

Assume that, for the state (3, 3), 10000111111 100001 is selected as the sync word when the last bit of the code word is "0", whereas 10000111111111100010 is selected as the sync word when the last bit of the code word is "1". Then, it will be known that the sync word starts in the state (1) that is illustrated in FIG. 6, if 10000111111100001 is detected at the time when the data is reproduced. If 10000111111111100010 is detected at the time of reproducing data, it will then be known that the sync word starts in the state (2) illustrated in FIG. 6.

Now consider a way of increasing the probability of detecting sync words. The constraint 1 on the sync word 1, described above, is maintained. By contrast, the constraints 2, 3 and 4 are modified. Sync words have hitherto a length of 20 bits. So long as the sync words have this length, there is no chance of raising the probability of detecting sync words. Therefore, the length of sync words is changed to 40 bits here. The constraints imposed on sync words for the purpose of increasing the probability of detecting sync words will be shown below.

[Constraints on Sync Word 2]

1, The sync word must have the aforementioned characteristics of 16/20 codes. (This is the same constraint on the sync word 1.)

2. The sync word must have a length of 40 bits. It would be best if the sync word could have a length of 20 bits. However, if the sync word had a length of 20 bits, there would be no room to increase the probability of detecting sync words. This is why the next shortest length of 40 bits is selected in order to impart the characteristics of 16/20 codes to the sync word.

3. A pattern consisting of 10 consecutive identical bits is repeated three times in the sync word. Thus, the sync word can be distinguished from a code sequence unless all three patterns, each consisting of 10 consecutive bits, are erroneous ones.

4. Ten or more identical bits must not continuously appear between the sync word and the code word that immediately precedes the sync word. It is desired that 10 or more identical bits be inhibited from continuously appearing in the sync word. But this cannot be achieved in the present embodiment. Nonetheless, the 16/20 code is so designed that 10 identical bits follow, one after another, between the sync word and the code word immediately following the sync word, because it is necessary to impart a value of 9 to $T_{max}$.

Not many block sync words observe all the constraints, 1 to 4, described above. Table 2 presented below shows candidates for the sync word, specifying the states of start and end points of each candidate. The constraint 3 described above is imposed on the sync word, in order to distinguish the sync word from a code sequence.

TABLE 2

Candidates for 40-Bit Sync Word

| No. | Start-point State | Sync Signal | End-point State |
|---|---|---|---|
| 1 | (3, 3) | 1000100111111111000 00000001111111111000 | (7, 7) |
| 2 | (3, 3) | 1010000111111111000 00000001111111111000 | (7, 7) |
| 3 | (3, 3) | 0010100111111111000 00000001111111111000 | (7, 7) |
| 4 | (3, 7) | 1011011000000000111 1111111000000000111 | (3, 3) |
| 5 | (3, 7) | 1001111000000000111 1111111000000000111 | (3, 3) |
| 6 | (3, 7) | 1101101000000000111 1111111000000000111 | (3, 3) |
| 7 | (3, 7) | 1110011000000000111 1111111000000000111 | (3, 3) |
| 8 | (3, 7) | 0111101000000000111 1111111000000000111 | (3, 3) |
| 9 | (3, 7) | 0110111000000000111 1111111000000000111 | (3, 3) |
| 10 | (3, 7) | 0011111000000000111 1111111000000000111 | (3, 3) |
| 11 | (7, 7) | 0110101000000000111 1111111000000000111 | (3, 3) |
| 12 | (7, 7) | 0101111000000000111 1111111000000000111 | (3, 3) |
| 13 | (7, 7) | 1101011000000000111 1111111000000000111 | (3, 3) |
| 14 | (7, 3) | 0100100111111111000 00000001111111111000 | (7, 7) |
| 15 | (7, 3) | 0110000111111111000 00000001111111111000 | (7, 7) |
| 16 | (7, 3) | 0010010111111111000 00000001111111111000 | (7, 7) |
| 17 | (7, 3) | 0001100111111111000 00000001111111111000 | (7, 7) |
| 18 | (7, 3) | 1000010111111111000 00000001111111111000 | (7, 7) |
| 19 | (7, 3) | 1001000111111111000 00000001111111111000 | (7, 7) |
| 20 | (7, 3) | 1100000111111111000 00000001111111111000 | (7, 7) |

Basically, the following two kinds of erroneous events may occur in the PRML Viterbi detector 56 shown in FIG. 7.

1. "0" changes to "1", or vice versa
2. "0101" changes to "1010", or vice versa.

Only one bit may be erroneous in one erroneous event. If so, any sync word shown in Table 2 can be distinguished from a code sequence unless three erroneous events overlap. However, a pattern identical to a sync word containing two erroneous bits may appear if the code sequence contains one erroneous bit. The probability that the code sequence has one erroneous bit is obviously higher than the probability that a pattern identical to a sync word containing two erroneous bits appears. Therefore, it is undesirable that a pattern having a sync word that contains two erroneous bits be detected as a sync word. Even if a pattern having a sync word that contains two erroneous bits is detected as a sync word, the probability of detecting errors remains low. This is because a pattern identical to this pattern does not appear unless the code sequence has two erroneous bits. Since a pattern having a sync word that contains 10 identical bits appearing one after another is used three times, a pattern having a sync word that contains one erroneous bit can be detected as a sync word. (Hereinafter, such a pattern shall be called an erroneous sync word. If only sync words having no erroneous bits are detected, the probability that no sync words can be detected is given as $Pe \times _{40}C_1$. If sync words containing one erroneous bit are detected, too, this probability will be represented as $Pe^2 \times _{40}C_2$. Obviously, the probability that no sync words can be detected is higher in the latter case, though how much higher depends on the value of the bit error rate Pe.

As has been described above, two or more erroneous bits may exist in one erroneous event. Thus, when two erroneous events overlap, 10 identical may cease to continuously follow one after another in a sync word. For example, a sync word, 1111111111000000000001111111111, may changes to:

11111111101000000000010111111111.

Or, a sync word, 0000000000111111111100000000000, may changes to:

00000000001011111111101000000000.

Therefore, these patterns should better be excluded beforehand from the code sequences in order to increase the probability of detecting sync words. It should be noted that these patterns are excluded from the 16/20 codes proposed in Japanese Patent Application No. 10-207372.

Tables 3a to 3e, presented below, show erroneous sync words that exist when the PRML Viterbi detection causes one erroneous event if the following digital values are selected as sync words which start in states (3, 3), (3, 7) (7, 3) and (7, 7), respectively:

1000100111111111000000000001111111111000,

1011011000000000111111111110000000000111, 0100100111111111000000000001111111111000, and

0111011000000000111111111110000000000111

These erroneous sync words can all be detected as sync words.

TABLE 3a

Erroneous 40-Bit Sync Words

| | | | |
|---|---|---|---|
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 0000100000 | 0011011000 | 1100100111 | 1111011000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 0100100111 | 0111011000 | 1000100111 | 1011011000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1100100111 | 0101011000 | 1010100111 | 0011011000 |
| 1111111000 | 0000000111 | 1111111000 | 0000000111 |
| 0000000111 | 1111111000 | 0000000111 | 1111111000 |

TABLE 3a-continued

Erroneous 40-Bit Sync Words

| | | | |
|---|---|---|---|
| 1111111000 | 0000000111 | 1111111000 | 0000000111 |
| 1010100111 | 1111011000 | 0000100111 | 0101011000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1001100111 | 1101011000 | 0010100111 | 0110011000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1001000111 | 1001011000 | 0110100111 | 0110111000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1001010111 | 1010011000 | 0101100111 | 0110101000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000000111 | 1010111000 | 0101000111 | 0111111000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000010111 | 1010101000 | 0101010111 | 0111101000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000110111 | 1011111000 | 0100110111 | 0111001000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000101111 | 1011101000 | 0100010111 | 0111010000 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |

TABLE 3b

Erroneous 40-Bit Sync Words

| | | | |
|---|---|---|---|
| 1000101011 | 1011001000 | 0100110111 | 0111010100 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000100011 | 1011010000 | 0100101111 | 0111011100 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000100101 | 1011010100 | 0100101011 | 0111011010 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000100110 | 1011011100 | 0100100011 | 0111011001 |
| 1111111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000100111 | 1011011010 | 0100100101 | 0111011000 |
| 0111111000 | 0000000111 | 1111111000 | 1000000111 |
| 0000000111 | 1111111000 | 0000000111 | 1111111000 |
| 1111111000 | 0000000111 | 1111111000 | 0000000111 |
| 1000100111 | 1011011001 | 0100100110 | 0111011000 |
| 1011111000 | 0000000111 | 1111111000 | 0000000111 |
| 0000000111 | 1111111000 | 0000000111 | 1111111000 |
| 1111111000 | 0000000111 | 1111111000 | 0000000111 |
| 1000100111 | 1011011000 | 0100100111 | 0111011000 |
| 1101111000 | 1000000111 | 0111111000 | 0010000111 |
| 0000000111 | 1111111000 | 0000000111 | 1111111000 |
| 1111111000 | 0000000111 | 1111111000 | 0000000111 |
| 1000100111 | 1011011000 | 0100100111 | 0111011000 |
| 1110011000 | 0100000111 | 1011111000 | 0001000111 |
| 0000000111 | 1111111000 | 0000000111 | 1111111000 |
| 1111111000 | 0000000111 | 1111111000 | 0000000111 |
| 1000100111 | 1011011000 | 0100100111 | 0111011000 |
| 1111011000 | 0010000111 | 1101111000 | 0000100111 |
| 0000000111 | 1111111000 | 0000000111 | 1111111000 |
| 1111111000 | 0000000111 | 1111111000 | 0000000111 |

TABLE 3b-continued

Erroneous 40-Bit Sync Words

| | | | |
|---|---|---|---|
| 1000100111 | 1011011000 | 0100100111 | 0111011000 |
| 1111101000 | 0001000111 | 1110111000 | 0000010111 |
| 0000000111 | 1111111000 | 0000000111 | 1111111000 |
| 1111111000 | 0000000111 | 1111111000 | 0000000111 |
| 1000100111 | 1011011000 | 0100100111 | 0111011000 |
| 1111110000 | 0000100111 | 1111011000 | 0000001111 |
| 0000000111 | 1111111000 | 0000000111 | 1111111000 |
| 1111111000 | 0000000111 | 1111111000 | 0000000111 |
| 1000100111 | 1011011000 | 0100100111 | 0111011000 |
| 1111101000 | 0000010111 | 1111101000 | 0000001011 |
| 0000000111 | 1111111000 | 0000000111 | 1111111000 |
| 1111111000 | 0000000111 | 1111111000 | 0000000111 |

TABLE 3c

Erroneous 40-Bit Sync Words

| | | | |
|---|---|---|---|
| 1000100111 | 1011011000 | 0100100111 | 0111011000 |
| 1111111100 | 0000001111 | 1111110000 | 0000000011 |
| 0000000111 | 1111111000 | 0000000111 | 1111111000 |
| 1111111000 | 0000000111 | 1111111000 | 0000000111 |
| 1000100111 | 1011011000 | 0100100111 | 0111011000 |
| 1111111010 | 0000001011 | 1111110100 | 0000000101 |
| 0000000111 | 1111111000 | 0000000111 | 1111111000 |
| 1111111000 | 0000000111 | 1111111000 | 0000000111 |
| 1000100111 | 1011011000 | 0100100111 | 0111011000 |
| 1111111001 | 0000000011 | 1111111100 | 0000000110 |
| 0000000111 | 1111111000 | 0000000111 | 1111111000 |
| 1111111000 | 0000000111 | 1111111000 | 0000000111 |
| 1000100111 | 1011011000 | 0100100111 | 0111011000 |
| 1111111000 | 0000000101 | 1111111010 | 0000000111 |
| 1000000111 | 1111111000 | 0000000111 | 0111111000 |
| 1111111000 | 0000000111 | 1111111000 | 0000000111 |
| 1000100111 | 1011011000 | 0100100111 | 0111011000 |
| 1111111000 | 0000000110 | 1111111001 | 0000000111 |
| 0100000111 | 1111111000 | 0000000111 | 1011111000 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0010000111 | 0111111000 | 1000000111 | 1101111000 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0001000111 | 1011111000 | 0100000111 | 1110111000 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0000100111 | 1101111000 | 0010000111 | 1111011000 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0000010111 | 1110111000 | 0001000111 | 1111101000 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0000000111 | 1111011000 | 0000100111 | 1111110000 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0000001011 | 1111101000 | 0000010111 | 1111110100 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0000000011 | 1111110000 | 0000001111 | 1111111100 |
| 1111111000 | 0000000111 | 1111111000 | 0000000111 |

TABLE 3d

Erroneous 40-Bit Sync Words

| | | | |
|---|---|---|---|
| 1000100111 | 1011011000 | 0100100111 | 0111011000 |
| 1111111000 | 0000000111 | 1111111000 | 0000000111 |

TABLE 3d-continued

Erroneous 40-Bit Sync Words

| | | | |
|---|---|---|---|
| 0000000101 | 1111110100 | 0000001011 | 1111111010 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0000000110 | 1111111100 | 0000000011 | 1111111001 |
| 1111111000 | 0000000111 | 1111111000 | 0000000111 |
| 1000100111 | 1011011000 | 0100100111 | 0111011000 |
| 1111111000 | 0000000111 | 1111111000 | 0000000111 |
| 0000000111 | 1111111010 | 0000000101 | 1111111000 |
| 0111111000 | 0000000111 | 1111111000 | 1000000111 |
| 1000100111 | 1011011000 | 0100100111 | 0111011000 |
| 1111111000 | 0000000111 | 1111111000 | 0000000111 |
| 0000000111 | 1111111001 | 0000000101 | 1111111000 |
| 1011111000 | 0000000111 | 1111111000 | 0100000111 |
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1101111000 | 1000000111 | 0111111000 | 0010000111 |
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1110111000 | 0100000111 | 1011111000 | 0001000111 |
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1111011000 | 0010000111 | 1101111000 | 0000100111 |
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1111101000 | 0001000111 | 1110111000 | 0000010111 |
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1111110000 | 0000100111 | 1111011000 | 0000001111 |
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1111110100 | 0000010111 | 1111101000 | 0000001011 |
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1111111000 | 0000001111 | 1111110000 | 0000000011 |
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1111111010 | 0000001011 | 1111110100 | 0000000101 |

TABLE 3e

Erroneous 40-Bit Sync Words

| | | | |
|---|---|---|---|
| 1000100111 | 1011011000 | 0100100111 | 0111011000 |
| 1111111000 | 0000000111 | 1111111000 | 0000000111 |
| 0000000111 | 1111111000 | 0000000111 | 1111111000 |
| 1111111001 | 0000000011 | 1111111100 | 0000000110 |
| | 1011011000 | 0100100111 | |
| | 0000000111 | 1111111000 | |
| | 1111111000 | 0000000111 | |
| | 0000000101 | 1111111010 | |
| | 1011011000 | 0100100111 | |
| | 0000000111 | 1111111000 | |
| | 1111111000 | 0000000111 | |
| | 0000000110 | 1111111001 | |

Each 40-bit sync word selected can be distinguished from the code sequence even if the PRML Viterbi detection causes two erroneous events. Hence, any 40-bit pattern extending between the sync word and the code word adjacent to the sync word should not become identical to the sync word in the course of the two erroneous events. Should there be a pattern which extends between the sync word and the adjacent code word and which is identical to the sync word, some measures should be taken to prevent the 16/20 code from including such a pattern. In the present embodiment, the code word in which the thirteenth to twentieth bits form a bit pattern 1011000 and the RDS of which is 3 at the end point, and the code word in which the thirteenth to twentieth bits form a bit pattern 0100111 and the RDS of which is 7 at the end point may be inhibited. Then, the 40-bit pattern extending between the sync word and the code word immediately preceding the sync word can be prevented from becoming identical to the sync word in the course of the two erroneous events. In the 18/20 code, the pattern extending between the sync word and the code word immediately following the sync word would not become identical to the sync word in the course of two erroneous events.

Assume a sync word 00010011111111110000000000 1111111111000 is detected when the data is reproduced. Let us initialize the likelihood of this sync word, in the same way as the likelihood of a 20-bit sync word. This sync word starts at ADS of 3 and ends at ADS of 7. Any erroneous sync word shown in Tables 3a to 3e may not be detected as a sync word. In this case, what has been described of the 20-bit sync word can apply to this 40-bit sync word. The initialization of likelihood would become complex in the case where any erroneous sync word, shown in Tables 3a to 3e, is detected as a sync word. Consider a sync word 000100111111111 10000000000001111111111000 that starts in state (3, 3). Of the erroneous sync words of this sync word, the following four cannot be distinguished from a sync word that starts in state (7, 3) and any erroneous sync word thereof:

00001001111111110000000000001111111111000
01000100111111110000000000001111111111000
11000100111111110000000000001111111111000
10101001111111110000000000001111111111000

Hence, it will be difficult to increase the likelihood of a particular state if the detection is started at the head of this sync word. In this case, the likelihood can be expected, nonetheless, to converge in the course of detecting of the sync word. If the likelihood were to be initialized, the same likelihood should be imparted to all states in which the sync word may start.

A sync word 1010100111111111100000000000111111 11111000 that starts in state (7, 3) ends at ADS of 7. That is, the end point of this sync word is the same as the end point of a sync word that starts in state (3, 3). Therefore, the sync word that remains does not change in respect of its end point even if the above-mentioned erroneous sync word is detected. That bit of the sync word which is at the end point does not change, either; it remains. If the detection starts with the code word that follows the sync word, the likelihood of the sync word can be set high, in the same way as the likelihood of a 20-bit sync word. Thus, even if one of the erroneous sync words of a sync word is identical to another sync word or an erroneous sync word thereof and even if the erroneous sync word of the sync word is detected as the sync word, the likelihood of the sync word can be set, provided that both sync words have the same ADS and an identical bit at the end point.

It is not that, the higher the likelihood set at the initialization, the better. Once the likelihood has been increased to a certain value, the effect remains the same. In addition, the resistor incorporated in the Viterbi detector for storing the likelihood has a limited bit width, and the shorter the bit width, the more desirable. If the likelihood is set too high, the data representing it will overflow the register that has a limited bit width. In the present embodiment, the distance $d^2_{free}$ (the least square Euclidean distance between two paths that start in a common state and end in a common state in the detection) may be 4. If so, the least square Euclidean distance between two paths that start in a common state and end at time 0 in different states in the detection of FIG. 6 will be 1. Hence, the least value for the difference in likelihood among four states at time 0 is also 1. It follows that the likelihood difference set at the initialization is sufficient if it has the value of 1. That is, the likelihood difference need not be greater than this value. A square Euclidean distance is scarcely used, without being modified, as the likelihood of the Viterbi detector. The Euclidean distance actually used as such is the value (generally called a metric obtained by subtracting common terms from the square Euclidean distances of the branches (i.e., arrows) at the same time in the detection of FIG. 6. The absolute value of the likelihood difference mentioned above therefore has no significance by itself Rather, the likelihood difference is a metric difference that corresponds to a likelihood difference of 1.

Figure 3:
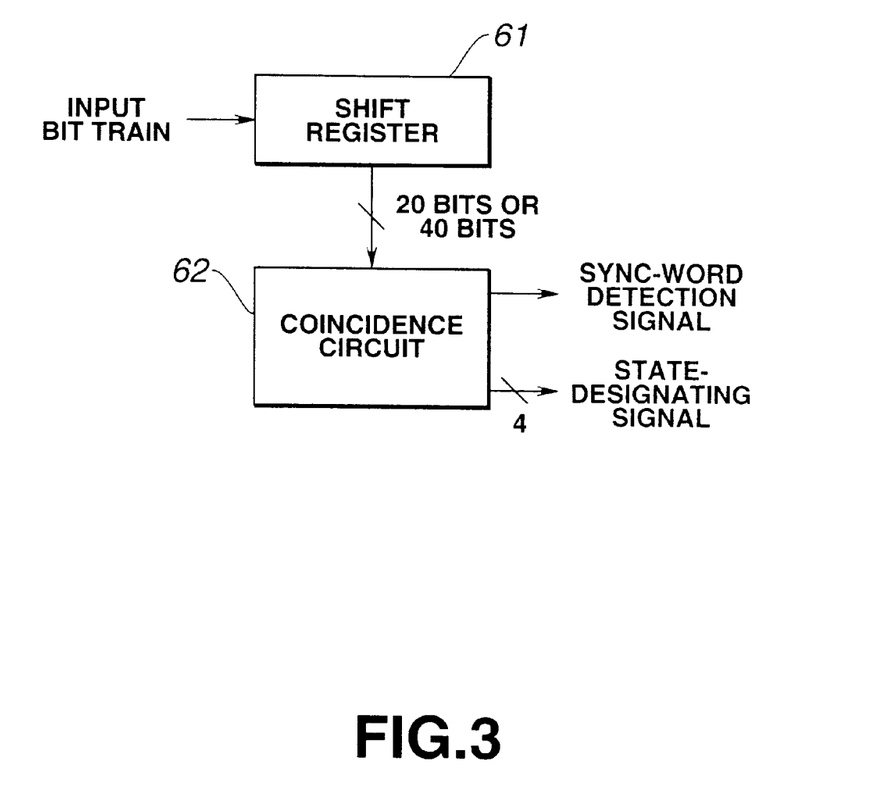
FIG. 3 is a block diagram illustrating the structure of the sync word detector incorporated in the reproduction apparatus.

FIG. 3 shows the structure of the sync word detector. The bit train output from the PRML Viterbi detector 56 is input to a shift register 61 having the same length as the sync word. All outputs of the shift register 61 are input to a coincidence circuit 62. The circuit 62 compares the sync word selected from those shown in Table 1 or Table 2, or the erroneous sync words shown in Tables 3a to 3e, with all outputs of the shift register 61, generating a coincidence/non-coincidence signal, or a sync-word detection signal. This signal is supplied to the TCPR Viterbi detector 58. If the signal is true (that is, if it represents the coincidence), it will initialize a counter at time 0. The counter controls the operation timing of the TCPR Viterbi detector 58 (i.e., the time-variant structure of the detection). The coincidence circuit 62 outputs a state-designating signal, too. This state-designating signal indicates the state in which the sync word detected starts or ends in the detection of FIG. 6. Some methods of designating the state may be proposed. In the present embodiment, the circuit 62 outputs a signal that designates one of the four states at time 0 in the detection of FIG. 6. As has been described, the state in which the sync word starts must be known in order to start the TCPR Viterbi detection from the head of the sync word, and the state in which the sync word ends must be known in order to start the TCPR Viterbi detection from the code word immediately following the sync word. In view of this, the state-designating signal is a necessary one.

Figure 4:
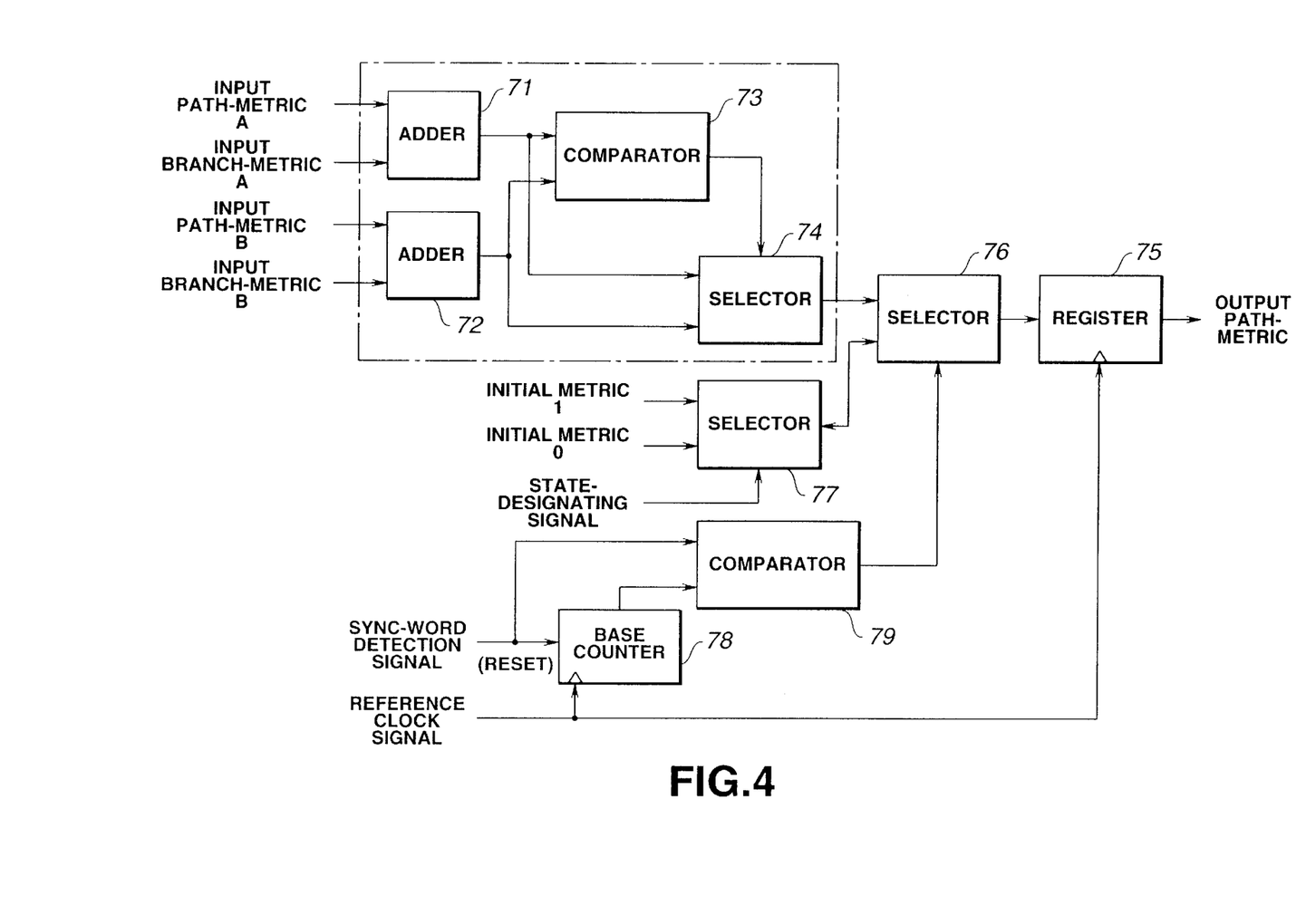
FIG. 4 is a block diagram depicting the structure of the ACS circuit incorporated in the reproduction apparatus.

FIG. 4 depicts the identical structure of the four ACS (Add Compare Select) circuits incorporated in the TCPR Viterbi detector 58. The four ACS circuits are allocated to the four states (1) to (4) shown in FIG. 6, respectively. That part of each ACS circuit, which is indicated by a broken-line rectangle, is well known as an ordinary ACS circuit. This part comprises an adder 71, an adder 72, a comparator 73, and a selector 74. The TCPR Viterbi detector 58 receives the sync-word detection signal and the state-designating signal, both having been output from the sync word detector 57. The sync-word detection signal is input to a base 78 and a comparator 79, whereas the state-designating signal is input to the select terminal of a selector 77.

The base counter 78 is initialized at time 0 by the sync-word detection signal output from the sync word detector 37. The base counter 78 is initialized and starts measuring time at the edge (either leading edge or trailing edge) of the reference clock signal. In other words, the base counter 78 is initialized if the sync-word detection signal is true at an edge of the reference clock signal (that is, if the sync-word detection signal indicates that a sync word has been detected). If the sync-word detection signal is false, the base counter 78 keeps measuring time at the edge of the reference clock signal. If there are no edges of the reference clock signal, the output of the base counter 78 will be held. In the case where the detection of FIG. 6 is used, the output of the comparator 79 will be true if the output of the base counter indicates time 19 and if the sync-word detection signal is true. Otherwise, the output of the comparator 79 will be false. The output of the comparator 79 is input to the select terminal of the selector 76. The selector 76 selects the output of a selector 77 if the output of the comparator 79 is false. If the output of the comparator 79 is true, the selector 76 selects the output of the selector 74, which is used as an ordinary metric value. The output of the selector 76 is input to a register 75 at an edge of the reference clock signal.

The sync-word detection signal may be input directly to the select terminal of the selector 76. Then, the selector 76 may select the output of the selector 77 if the sync-word detection signal is true (that is, if the sync-word detection signal indicates that a sync word has been detected), and selects the output of the selector 74 if the sync-word detection signal is false. In this case, the likelihood of the state in which the sync word starts (or ends) in the detection can be set higher than the likelihood of any other state at the same time. If so, however, the path-metric is initialized every time a sync word is detected. The path-metric need not be initialized if the time indicated by the base counter true at the time the sync word is detected, provided that the Viterbi detection has been synchronized. This is because the ordinary path-metric represented by the output of the selector 74 must correctly reflect the structure of the detector shown in FIG. 6. If the path-metric is initialized, however, a predetermined metric may distort the value that the path-metric should have. In the embodiment of this invention, the path-metric is initialized only if the Viterbi detector is not synchronized, that is, only if the time the code sequence is input does not coincide with time indicated by the base counter 78.

Thus, it is possible to prevent the path-metric from being distorted.

What is claimed is:

1. An apparatus for performing Viterbi detection to detect a sync word in a trellis code sequence having a time-variant structure, comprising:

a partial response detector for asynchronously detecting a bit train containing said sync word in the trellis code sequence by performing a partial response maximum likelihood Viterbi detection; the values of a start point and an end point of said sync word corresponding to one of a plurality of states in a trellis;

a sync-word detector for detecting said sync word in the bit train detected by said partial response detector and outputting a detection signal and a state-designating signal;

a delay element for delaying said trellis code sequence during processing by said partial response detector and said sync-word detector; and a trellis-coded partial response detector for synchronously detecting said sync word in the delayed trellis code sequence by performing a trellis-coded partial response Viterbi detection on the basis of said detection signal and said state-designating signal; said detection signal being used to synchronize the trellis-coded partial response detector and said state-designating signal being used to indicate the state corresponding to the values of the start point and the end point of said sync word.

2. The apparatus according to claim 1, wherein the trellis-coded partial response detector comprises:

a comparator for comparing said detection signal to a reference clock signal and outputting a coincidence signal, thereby synchronizing the detector;

a first selector for selecting an initial metric value on the basis of said state-designating signal; and a second selector for selecting between an output of an Add-Compare-Select circuit and the selected initial metric value on the basis of said coincidence signal.

3. A method of performing Viterbi detection to detect a sync word in a trellis code sequence having a time-variant structure, comprising the steps of:

a partial response detection step of asynchronously detecting a bit train containing said sync word in the trellis code sequence by performing a partial response maximum likelihood Viterbi detection; the values of a start point and an end point of said sync word corresponding to one of a plurality of states in a trellis;

a sync-word detection step of detecting said sync word in the bit train detected in said partial response detection step and outputting a detection signal and a state-designating signal;

a delay step of delaying said trellis code sequence during processing in said partial response detection and said sync-word detection steps; and a trellis-coded partial response detection step of synchronously detecting said sync word in the delayed trellis code sequence by performing a trellis-coded partial response Viterbi detection on the basis of said detection signal and said state-designating signal; said detection signal being used to synchronize the trellis-coded partial response detection step and said state-designating signal being used to indicate the state corresponding to the values of the start point and the end point of said sync word.

4. An apparatus for performing Viterbi detection to detect a sync word in a trellis code sequence having a time-variant structure, comprising:

a partial response detector for asynchronously detecting a bit train containing said sync word in the trellis code sequence by performing a partial response maximum likelihood Viterbi detection;

a sync-word detector for detecting said sync word in the bit train detected by said partial response detector and outputting a detection signal and a state-designating signal;

a delay element for delaying said trellis code sequence during processing by said partial response detector and said sync-word detector; and a trellis-coded partial response detector for synchronously detecting a maximum likelihood response in the delayed trellis code sequence by performing a trellis-coded partial response Viterbi detection; wherein a likelihood value of the trellis-coded partial response detector is initialized on the basis of the detection signal and the state-designating signal when the trellis-coded partial response detector is not synchronized with the trellis code sequence.

5. A method of performing Viterbi detection to detect a sync word in a trellis code sequence having a time-variant structure, comprising the steps of:

a partial response detection step of asynchronously detecting a bit train containing said sync word in the trellis code sequence by performing a partial response maximum likelihood Viterbi detection;

a sync-word detection step of detecting said sync word in the bit train detected in said partial response detection step and outputting a detection signal and a state-designating signal;

a delay step of delaying said trellis code sequence during processing in said partial response detection and said sync-word detection steps; and a trellis-coded partial response detection step of synchronously detecting a maximum likelihood response in the delayed trellis code sequence by performing a trellis-coded partial response Viterbi detection; wherein a likelihood value of the trellis-coded partial response detector is initialized on the basis of the detection signal and the state-designating signal when the trellis-coded partial response detector is not synchronized with the trellis code sequence.

* * * * *